US007010852B2

(12) United States Patent
Ogimoto

(10) Patent No.: US 7,010,852 B2
(45) Date of Patent: Mar. 14, 2006

(54) APPARATUS AND METHOD FOR CARRYING SUBSTRATE

(75) Inventor: Shinichi Ogimoto, Ebina (JP)

(73) Assignee: Shibaura Mechatronics Corporation, Yokohama (JP)

( * ) Notice: Subject to any disclaimer, the term of this patent is extended or adjusted under 35 U.S.C. 154(b) by 264 days.

(21) Appl. No.: 10/069,720

(22) PCT Filed: Jun. 1, 2001

(86) PCT No.: PCT/JP01/04668

§ 371 (c)(1),
(2), (4) Date: Feb. 28, 2002

(87) PCT Pub. No.: WO02/00534

PCT Pub. Date: Jan. 3, 2002

(65) Prior Publication Data

US 2003/0000075 A1 Jan. 2, 2003

(30) Foreign Application Priority Data

Jun. 29, 2000 (JP) ............................ 2000-196586

(51) Int. Cl.
*B23P 19/00* (2006.01)

(52) U.S. Cl. ............................ 29/740; 29/739; 29/741; 29/759; 294/64.1

(58) Field of Classification Search .................. 29/739, 29/740, 741, 759; 294/64.1
See application file for complete search history.

(56) References Cited

U.S. PATENT DOCUMENTS

| | | | | |
|---|---|---|---|---|
| 4,202,092 | A * | 5/1980 | Shibasaki et al. | 29/741 |
| 4,649,635 | A * | 3/1987 | Asai et al. | 29/759 |
| 5,115,559 | A * | 5/1992 | Oyama | 29/720 |
| 5,692,292 | A * | 12/1997 | Asai et al. | 29/740 |
| 6,223,425 | B1 * | 5/2001 | Asai et al. | 29/740 |
| 6,631,798 | B1 * | 10/2003 | Gordon et al. | 198/345.2 |

FOREIGN PATENT DOCUMENTS

| | | |
|---|---|---|
| JP | 4-40597 | 4/1992 |
| JP | 40597/1992 | 4/1992 |
| JP | 10-316243 | 12/1998 |
| JP | 11-344530 | 12/1999 |
| JP | 2000-079983 | 3/2000 |
| JP | 2000-296915 | 10/2000 |

* cited by examiner

*Primary Examiner*—Carl J. Arbes
(74) *Attorney, Agent, or Firm*—Oblon, Spivak, McClelland, Maier & Neustadt, P.C.

(57) ABSTRACT

A substrate carrying device reduces time necessary for conducting changing work for changing the types of flat panel displays or the like. A substrate support member (10) has a support body (11) provided with an outer peripheral part (11*a*), which is joined to an inner peripheral part (21*b*) of an extension support member (20) to connect the substrate support member (10) to the extension support member (20). Only by the substrate support member (10) is used for supporting a small glass substrate (41) to carry the small glass substrate (41). A combination of the substrate support member (10) and the extension support member (20) is used for supporting a large glass substrate (41') to carry the large glass substrate (41').

12 Claims, 7 Drawing Sheets

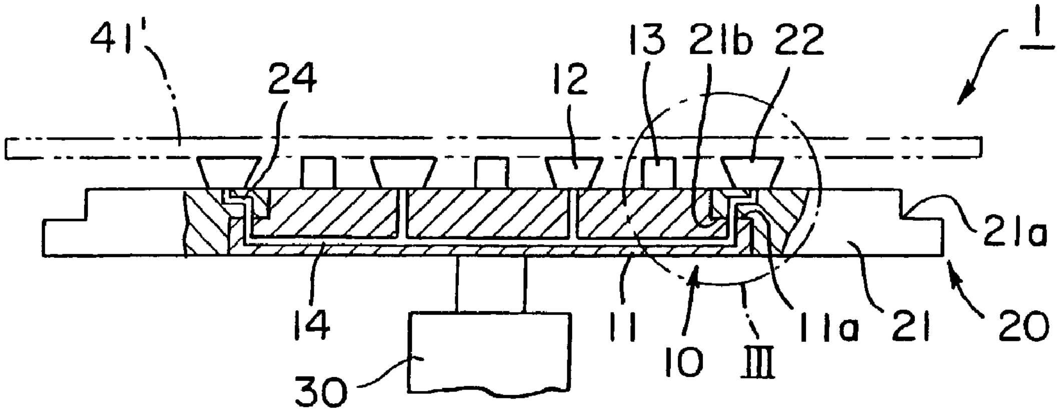
F I G. 2
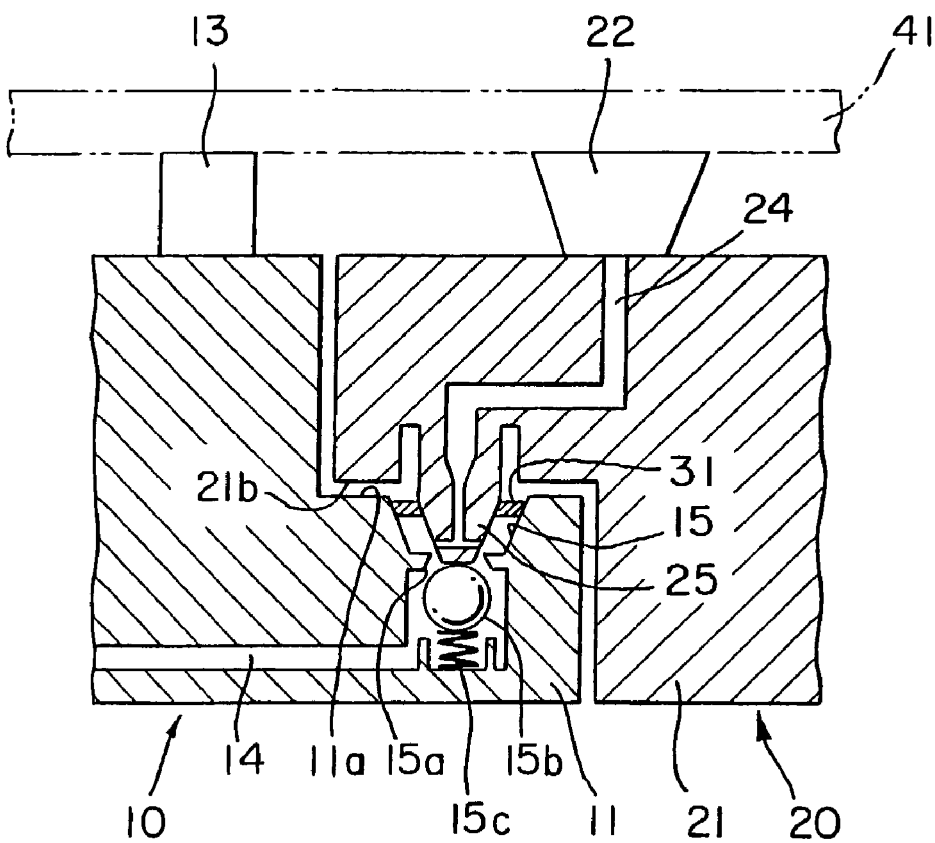
F I G. 3

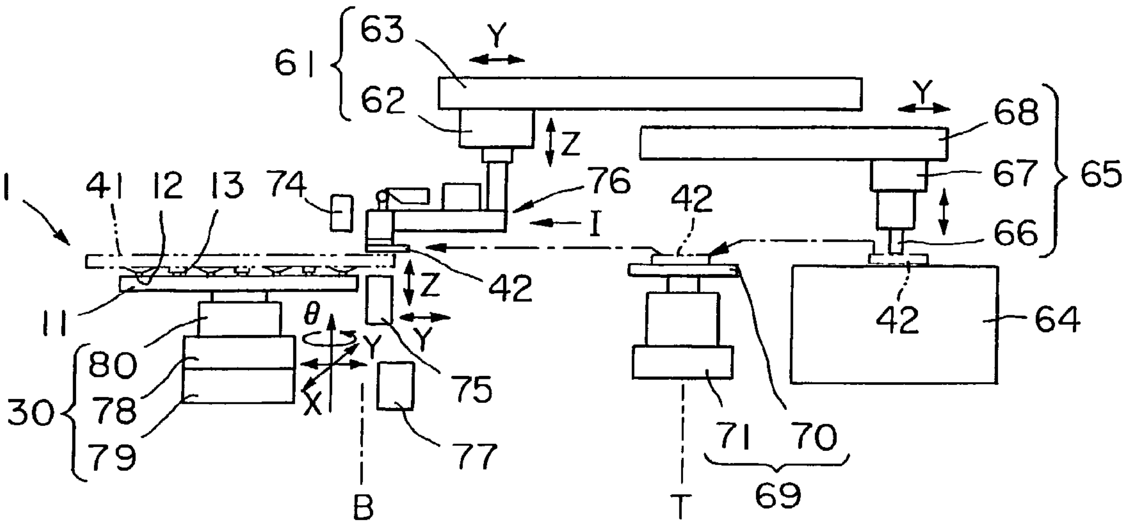
F I G. 5A
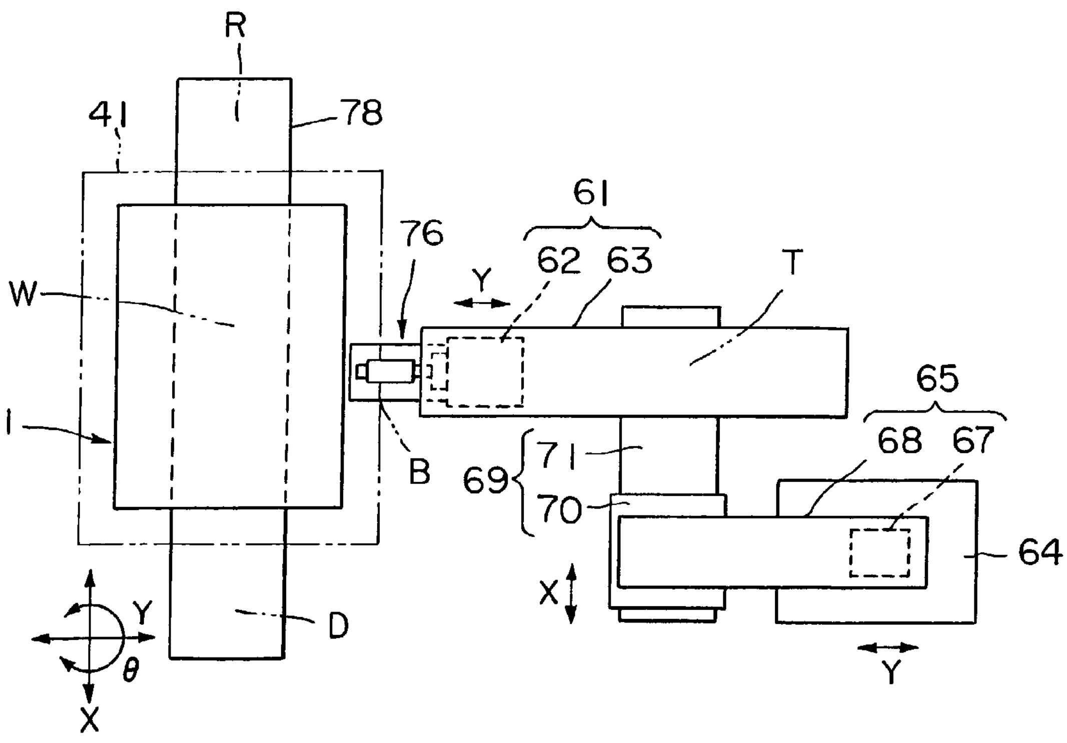
F I G. 5B

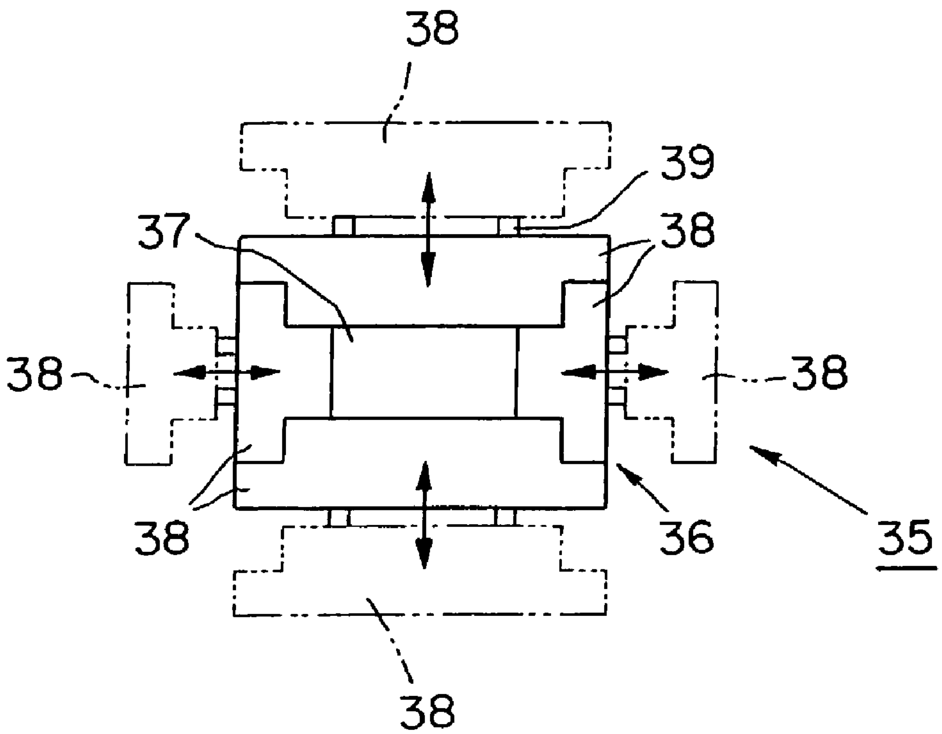
F I G. 6A
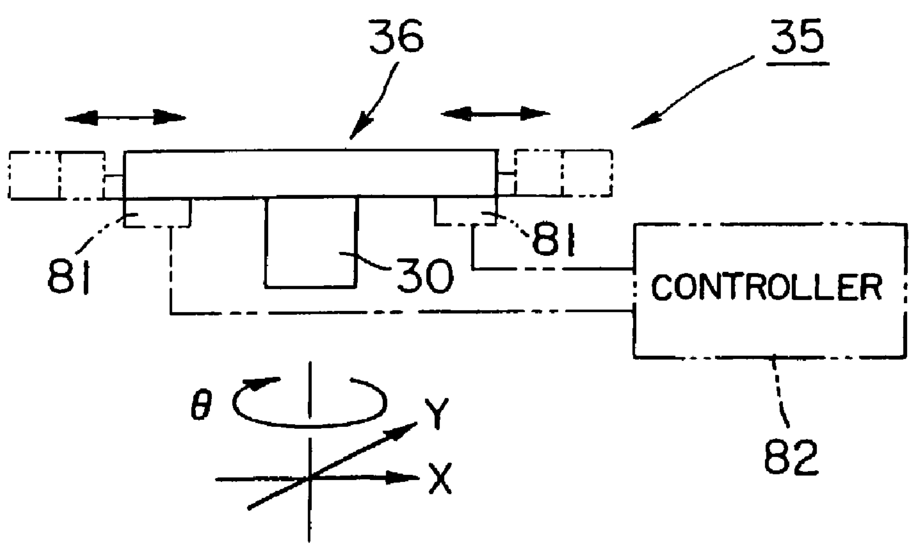
F I G. 6B

APPARATUS AND METHOD FOR CARRYING SUBSTRATE

TECHNICAL FIELD

The present invention relates to a part-mounting apparatus and a part-mounting method to be used in fabricating a flat panel display or the like represented by a liquid crystal display. More particularly, the present invention relates to a substrate carrying device and a substrate carrying method for transferring substrates between processes.

BACKGROUND ART

A conventional part-mounting apparatus for use in fabricating a flat panel display represented by a liquid crystal panel mounts a flexible electronic part, such as a FPC (flexible printed circuit), a COF (chip-on-film) circuit, a TCP (tape carrier package) or the like on a glass substrate.

Generally, such a part-mounting apparatus includes a substrate carrying device for positioning a glass substrate at a working position and carrying a glass substrate between working positions.

FIGS. 8A and 8B show a conventional substrate carrying device 50. As shown in FIG. 8A, the substrate carrying device 50 includes a transfer mechanism 53 capable of translational movement and rotation in an XY-plane, and a substrate support member 51 attached to the transfer mechanism 53 to support a glass substrate 41 thereon.

Glass substrates for flat panel displays or the like are formed in different sizes corresponding to the types of flat panel displays. Therefore, the substrate carrying device 50 is required to carry those glass substrates having different sizes. When conducting changing work for changing the types of flat panel displays, the substrate support member 51 of the conventional substrate carrying device 50 is replaced with another one of a size corresponding to that of a new type of flat panel displays. More concretely, as shown in FIGS. 8A and 8B, a substrate support member 51 for carrying small substrates 41 is attached to the transfer mechanism 53 when the substrate carrying device 50 is used for carrying the small substrate 41, (FIG. 8A), and a substrate support member 52 for carrying large substrates 41' is attached to the transfer mechanism 53 when the substrate carrying device 50 is used for carrying the large substrate 41', (FIG. 8B).

Thus the conventional substrate carrying device 50 changes the substrate support members when the types of flat panel displays are changed to use a substrate support member of a size corresponding to that of glass substrates to be carried.

However, the size of glass substrates for forming flat panel displays has progressively enlarged in recent years and the weight of the substrate support member of the substrate carrying device 50 has increased accordingly. Therefore, changing the substrate support members requires very difficult work and much time.

SUMMARY OF THE INVENTION

The present invention has been made in view of the foregoing problems and it is therefore an object of the present invention to provide a substrate carrying device and a substrate carrying method capable of reducing time necessary for achieving changing work for changing the types of flat panel displays, a part-mounting apparatus provided with the substrate carrying device, and a part-mounting method.

According to a first aspect of the present invention, a substrate carrying device includes a transfer mechanism; and a substrate support member attached to the transfer mechanism and supporting a substrate, wherein the substrate support member includes a connecting part for connecting the substrate support member to an extension support member so as to support the substrate in cooperation with the substrate support member.

In the substrate carrying device according to the first aspect of the present invention, it is preferable that the substrate support member includes a support body having a support surface, the support body having a peripheral connecting part adapted to be joined to a peripheral connecting part formed in the extension support member. Preferably, the substrate support member includes a support body having a support surface; a suction member attached to the support surface of the support body and adapted to attract and hold the substrate; a suction passage extended in the support body and connected to the suction member; and a connecting structure for connecting the suction passage to a suction passage included in the extension support member, and wherein the connecting structure connects the suction passage of the substrate support member to the suction passage of the extension support member when the extension support member is connected to the substrate support member. Preferably, the substrate support member includes a support body having a support surface; a suction member attached to the support surface of the support body and adapted to attract and hold the substrate; and a flatness adjusting mechanism for adjusting the flatness of the substrate held by the suction member. Preferably, the extension support member includes a support body having a support surface; a suction member attached to the support surface of the support body and adapted to attract and hold the substrate; and a flatness adjusting mechanism for adjusting the flatness of the substrate held by the suction member. Preferably, the substrate carrying device further includes an electronic part support member for supporting an electronic part mounted on the substrate. Preferably, the substrate carrying device further includes a detecting device that detects the condition of connection of the extension support member to the substrate support member; and a decision device that decides whether or not a substrate to be carried is suitable for carrying, on the basis of the result of detection by the detecting device and the size of the substrate to be carried.

According to a second aspect of the present invention, a substrate carrying device includes a transfer mechanism; and a substrate support member attached to the transfer mechanism and supporting a substrate, wherein the substrate support member includes a first support part, and a second support part movably connected to the first support part so as to support the substrate in cooperation with the first support part.

It is preferable that the substrate carrying device according to the second aspect of the present invention further includes a driving mechanism that drives the second support part for movement relative to the first support part; and a controller that controls a distance for which the second support parts is moved by the driving mechanism, on the basis of the size of the substrate to be carried.

According to a third aspect of the present invention, a substrate carrying method includes the steps of: supporting a substrate on a substrate support member attached to a transfer mechanism; and carrying the substrate, wherein an extension support member for supporting the substrate in cooperation with the substrate support member can be detachably attached to the substrate support member, so that the substrate support member and the extension support member are used in either a state where only the substrate support member is used, or a state where the substrate support member is combined with the extension support member, depending on the size of the substrate to be carried.

According to a fourth aspect of the present invention, a part-mounting apparatus of mounting an electronic part on a substrate includes: a substrate carrying device that carries the substrate to a working position; a part carrying device that carries the electronic part to a mounting position corresponding to the substrate positioned at the working position; and a pressing tool that presses, at the mounting position, the electronic part carried by the part carrying device to the substrate carried by the substrate carrying device so as to mount the electronic part on the substrate, wherein the substrate carrying device includes a substrate support member for supporting the substrate, the substrate support member including a connecting part for connecting the substrate support member to an extension support member so as to support the substrate in cooperation with the substrate support member.

According to a fifth aspect of the present invention, a part-mounting method of mounting an electronic part on a substrate includes the steps of: supporting a substrate on a substrate support member included in a substrate carrying device; positioning the substrate at a working position by the substrate carrying device; carrying an electronic part to a mounting position corresponding to the substrate positioned at the working position; and pressing, at the mounting position, the electronic part carried by the part carrying device to the substrate positioned at the working position by the substrate carrying device to mount the electronic part on the substrate, wherein the substrate support member includes a connecting part for connecting the substrate support member to an extension support member so as to support the substrate in cooperation with the substrate support member, and the step of supporting the substrate by the substrate carrying device includes a step of handling the extension support member to connect the extension support member to the substrate support member by the connecting part or to disconnect the same from the substrate support member, depending on the size of the substrate.

According to the first, the third, the fourth and the fifth aspect of the present invention, the extension support member can be connected to the substrate support member attached to the transfer mechanism or the like, in order to support a substrate in cooperation with the substrate support member. Therefore, it is possible to cope with the change of the sizes of the substrates resulting from the change of the types of flat panel displays or the like, by connecting the extension support member to or disconnecting the same from the substrate support member. Only the comparatively light part, i.e., the extension support member, needs to be changed instead of changing the entire structure for supporting a substrate, i.e., the substrate support member and the extension support member, to carry a large substrate. Since the operator is able to handle the extension support member easily, time necessary for conducting changing work for changing the types of flat display panels or the like can be reduced.

According to the first aspect of the present invention, the substrate support member and the extension support member can be easily connected together simply by joining the engaging part formed in the peripheral part of the support body of the substrate support member to the end part of the extension support member. The suction passage of the substrate support member and that of the extension support member can be connected by a connecting structure when the substrate support member and the extension support member are combined together. Thus both the respective suction passages of the substrate support member and the extension support member can be easily connected with both the respective suction members of the substrate support member and the extension support member being in suction by the same vacuum source for suction. Since the substrate support member or the extension support member includes the suction member attached to the support surface of the support body and adapted to attract and hold the substrate, and the flatness adjusting mechanism for adjusting the flatness of the substrate held by the suction member, the flatness of a peripheral part of the substrate mounted with an electronic part can be easily adjusted and hence the electronic part can be satisfactorily mounted on the substrate. The electronic part mounted on the substrate can be effectively prevented from drooping by using the electronic part support member for supporting the electronic part mounted on the substrate. Since the decision device decides whether or not a substrate to be carried is suitable for carrying, on the basis of the result of detection of the condition of connection of the extension support member to the substrate support member and the size of the substrate to be carried, measures to cope with the change of the types of flat panel displays or the like can be surely taken.

According to the second aspect of the present invention, since the substrate support member includes the second support part adapted to be movably connected to the first support part, it is possible to cope with the change of the types of flat panel displays or the like and the resultant change of the sizes of the substrates, simply by moving the second support part, so that time necessary for conducting changing work for changing the types of flat display panels or the like can be reduced.

According to the second aspect of the present invention, since a distance for which the second support part is moved is controlled on the basis of the size of the substrate to be carried, measures to cope with the change of the types of flat panel displays or the like can be surely taken in a short time.

BRIEF DESCRIPTION OF THE DRAWINGS

FIG. 2 is a partly sectional side elevation of the substrate carrying device shown in FIG. 1B;

FIG. 3 is an enlarged view of a part III in FIG. 2;

FIGS. 5A and 5B are a side elevation and a plan view, respectively, of a part-mounting apparatus provided with a substrate carrying device according to the present invention;

FIGS. 6A and 6B are a plan view and a side elevation, respectively, of a substrate carrying device in a second embodiment of the present invention;

BEST MODE FOR CARRYING OUT THE INVENTION

Figure 1A:
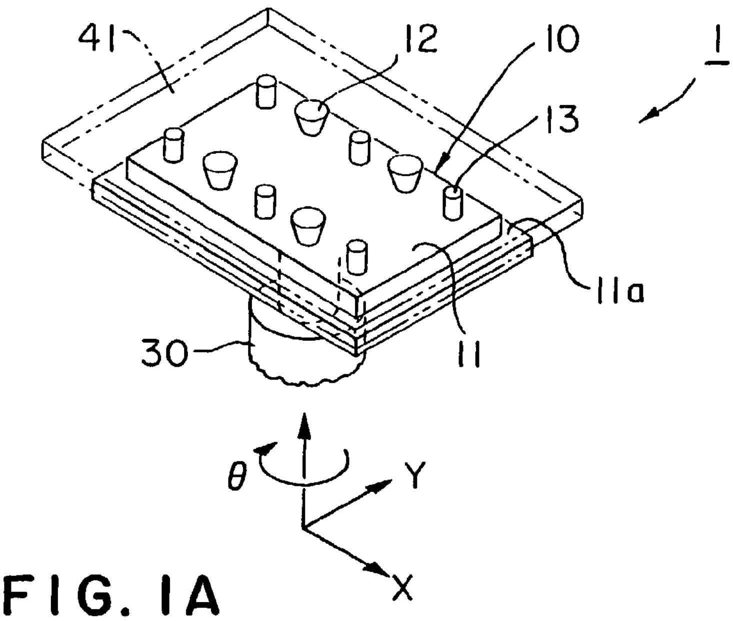
FIGS. 1A and 1B are perspective views of a substrate carrying device in a first embodiment of the present invention.

Preferred embodiments of the present invention will be described hereinafter with reference to the accompanying drawings.

First Embodiment

A substrate carrying device in a first embodiment of the present invention will be described with reference to FIGS. 1A to 5B.

First, the general construction of a part-mounting apparatus relating to the present invention will be described with reference to FIGS. 5A and 5B.

Referring to FIGS. 5A and 5B, a part-mounting apparatus for mounting an electronic part 42 on a glass substrate 41 is provided with a pressing tool 76 and a transfer mechanism 61 for moving the pressing tool 76. The electronic part 42 held on the pressing tool 76 by suction is mounted on the glass substrate 41. The transfer mechanism 61 has a Z-axis transfer unit 62 for moving the pressing tool 76 in vertical directions, i.e., directions along a Z-axis, and a Y-axis transfer unit 63 for moving the pressing tool 76 in horizontal directions, i.e., directions along a Y-axis. The electronic part 42 held on the pressing tool 76 by suction can be carried from a transfer position T to a mounting position B corresponding to a peripheral part of the glass substrate 41.

The electronic part 42 is fed by a part feeder 64 comprising a tray, a punching mechanism or such, and is carried to an intermediate stage 69 by a part transfer mechanism 65. The part transfer mechanism 65 has a suction nozzle 66 adapted to attract the electronic part 42 by suction, a Z-axis transfer unit 67 for moving the suction nozzle 66 in directions along the Z-axis, and a Y-axis transfer unit 68 for moving the suction nozzle 66 together with the Z-axis transfer unit 67 in directions along the Y-axis. The intermediate stage 69 has a table 70 for supporting the electronic part 42 thereon, and an X-axis transfer unit 71 for moving the table 70 in horizontal directions along the X-axis.

The part transfer mechanism 65, the intermediate stage 69, the transfer mechanism 61 and the pressing tool 76 constitute a part carrying device.

The glass substrate 41 on which the electronic part 42 is to be mounted is carried by a substrate carrying device 1. The substrate carrying device 1 has a transfer mechanism 30 capable of translational movement and rotation in an XY-plane, and a substrate support member 10 for supporting a glass substrate 41 (41'). The transfer mechanism 30 has an X-table 78, a Y-table 79 and a θ-table 80 and is adapted to position the glass substrate 41 at any one of a receiving position R, a working position W and a delivery position D. A pressure block 75 is disposed at the mounting position B opposite to the pressing tool 76 as positioned at the mounting position B. When connecting the electronic part 42 to the glass substrate 41 by the pressing tool 76, the pressure block 75 supports a peripheral part of the glass substrate 41 positioned at the mounting position B by the transfer mechanism 30 of the substrate carrying device 1 from below when the pressing tool 76 mounts the electronic part 42 on the glass substrate 41. An imaging device 77 for forming an image of the glass substrate 41 and the electronic part 42 is disposed at the mounting position B. The pressure tool 75 is moved away from the visual field of the imaging device 77 when the imaging device 77 forms an image of the glass substrate 41 and the electronic part 42. The glass substrate 41 and the electronic part 42 are provided with positioning marks, respectively. The imaging device 77 forms an image of a region including those positioning marks. An image formed by the imaging device 77 is processed by an image processing device, not shown, to recognize the respective positions of the glass substrate 41 and the electronic part 42.

Figure 1B:
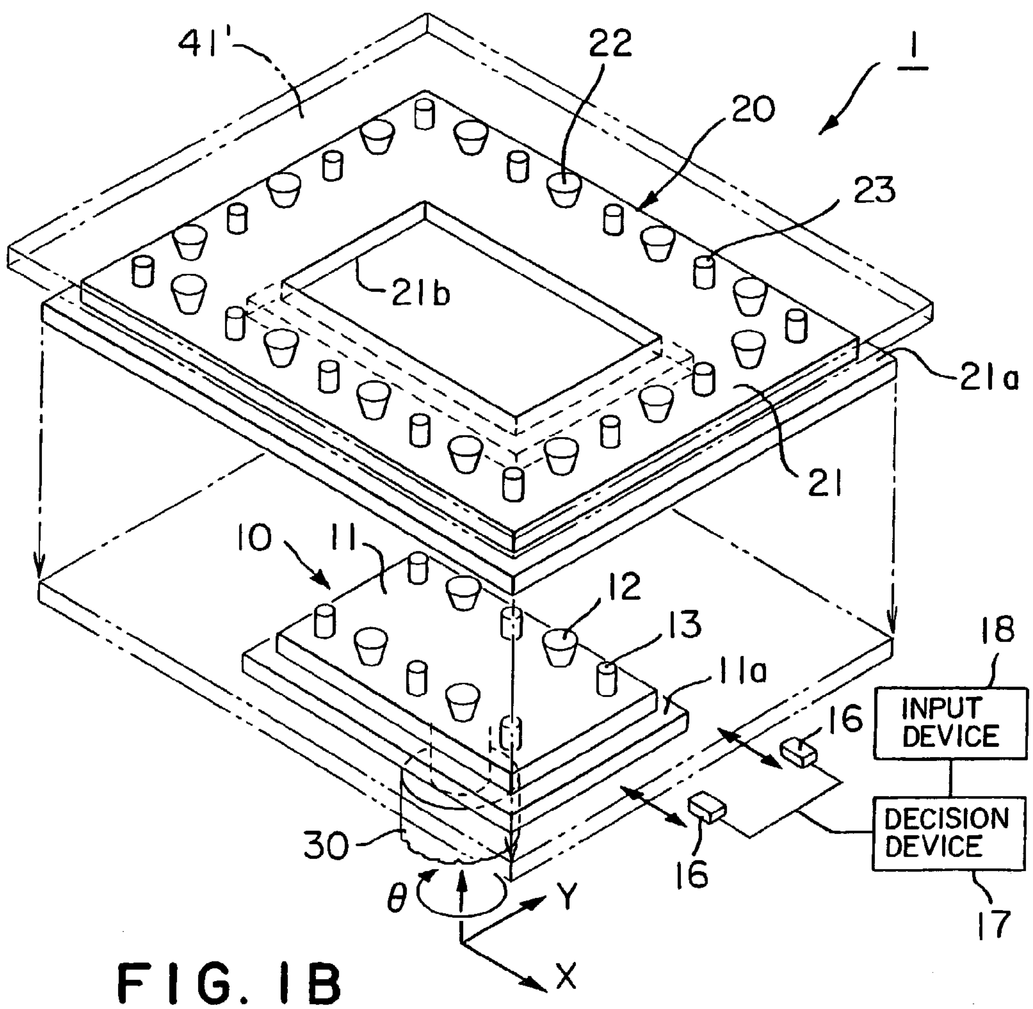
Figure 4A:
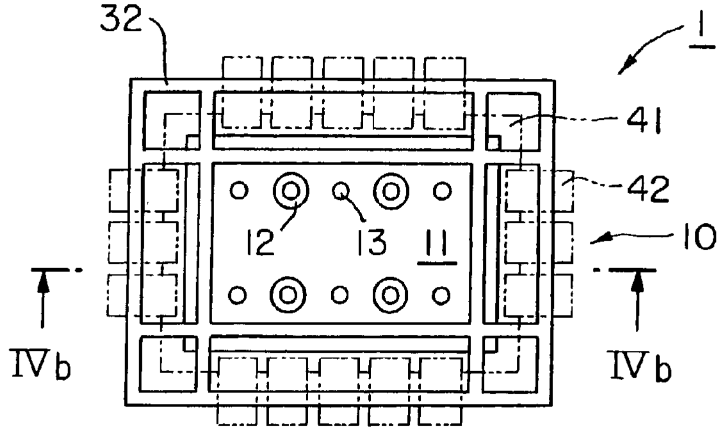
FIGS. 4A, 4B, 4C and 4D are views of substrate carrying devices in modifications of the substrate carrying device shown in FIGS. 1A and 1B.
Figure 4B:
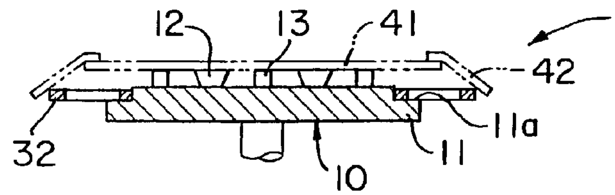
Figure 4C:
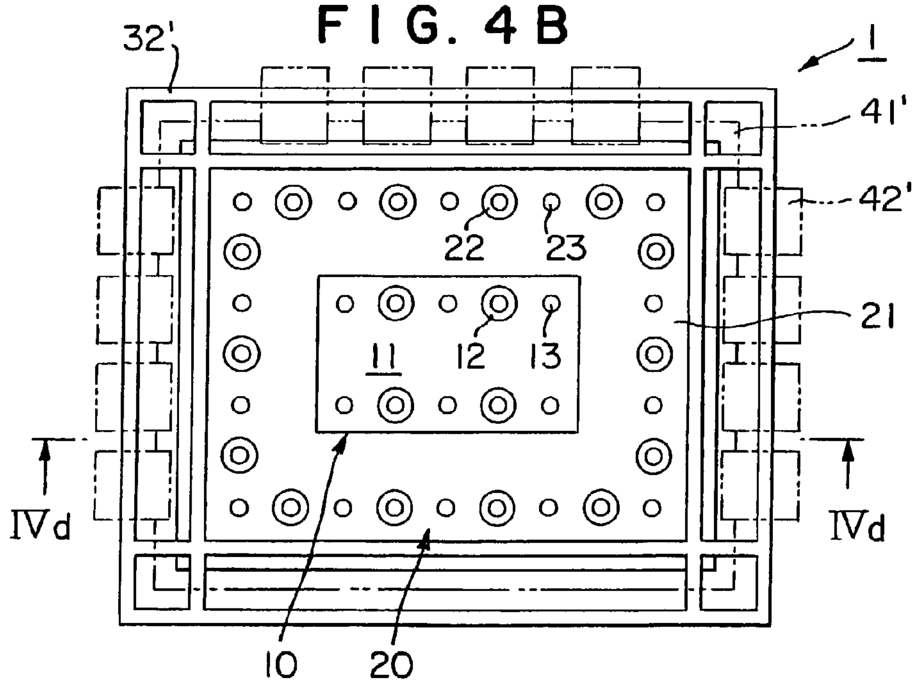
Figure 4D:
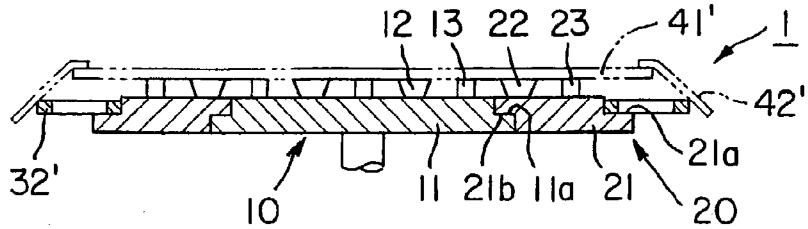

The substrate carrying device 1 shown in FIGS. 5A and 5B will be described with reference to FIGS. 1A and 1B. FIGS. 1A and 1B show a state where the substrate carrying device 1 carries a small glass substrate for a flat panel display and a state where the substrate carrying device 1 carries a large glass substrate for a flat panel display, respectively.

Referring to FIGS. 1A and 1B, the substrate carrying device 1 has the transfer mechanism 30 capable of translational movement and rotation in an XY-plane, and the substrate support member 10 for supporting the glass substrate 41 (41').

The substrate support member 10 has a support body 11. A peripheral part of the support body 11 is formed in a connecting peripheral part *11a* adapted to be fitted in a connecting peripheral part *21b* formed in an inner peripheral part of a support body 21 included in an extension support member 20. Only the substrate support member 10 is used for carrying the small substrate 41. The extension support member 20 is combined with the substrate support member 10 to support the large substrate 41'. Suction pads (suction members) 12 for holding the glass substrate 41 by suction, and a flatness adjusting mechanism 13 are arranged on the upper surface (support surface) of the support body 11 of the substrate support member 10. Suction pads 22 and a flatness adjusting mechanism 23, which are similar to those of the substrate support member 10, are arranged on the upper surface (support surface) of the support body 21 of the extension support member 20.

The flatness adjusting mechanisms 13 and 23 may include posts adapted to be moved for height adjustment and to be shifted for positional adjustment. The warp and undulation of the glass substrates 41 and 41' can be effectively corrected by the cooperative actins of the flatness adjusting mechanisms 13 and 23 and the suction pads 12 and 22. More concretely, a height measuring device 74 (FIG. 5A) is moved along the edges of the glass substrate 41 (41') to measure the warp and undulation of the edges of the glass substrate 41 (41'). Then, the respective heights and positions of the posts of the flatness adjusting mechanism 13 (23) are adjusted according to the measured warp and undulation. Subsequently, the glass substrate 41 (41') is attracted from below by the suction pads 12 (22). Consequently, the warp and undulation of the glass substrate 41 (41') are corrected by suction exerted downward by the suction pads 12 (22) on the glass substrate 41 (41') and reaction forces exerted upward on the glass substrate 41 (41') by the posts of the flatness adjusting mechanism 13 (23), so that the peripheral part of the glass substrate 41 (41') can be held at the same level.

As shown in FIGS. 1A and 1B, the substrate carrying device 1 is provided with detecting devices 16 for detecting the condition of connection of the extension support member 20 to the substrate support member 10. The detecting devices 16 can move between an outer region around the extension support member 20 and an inner region around the substrate support member 10. A decision device 17 decides whether or not the extension support member 20 is connected to the substrate support member 10, on the basis of the variation of an output signal provided by the detecting devices 16 while the detecting devices 16 move between the outer region and the inner region. The decision device 17 may decide whether or not a substrate to be carried is suitable for carrying, on the basis of result of the detecting operation of the detecting devices 16 and the size of a glass substrate to be carried given by an input device 18. Preferably, a warning is given to the operator when the decision device 17 decides that the glass substrate is not suitable for carrying by the substrate carrying device 1.

The substrate support member 10 and the extension support member 20 will be described in detail with reference to FIGS. 2 and 3. Referring to FIGS. 2 and 3, suction passages 14 and 24 are extended in the respectively support bodies 11 and 21 of the substrate support member 10 and the extension support member 20, respectively. The suction passages 14 and 24 are connected to the suction pads 12 and 22, respectively. At least either the suction passage 14 or the suction passage 24 is connected to a vacuum source, not shown. The suction passages 14 and 24 open into a recess 15 and a projection 25 formed in the peripheral parts 11*a* and 21*b* of the support bodies 11 and 21, respectively. When the peripheral parts 11*a* and 21*b* of the support bodies 11 and 21 of the substrate support member 10 and the extension support member 20 are engaged, the projection 25 is received in the recess 15, and a gap between the side surface of the recess 15 and the projection 25 is sealed by a sealing member 31. Thus the suction passage 14 of the substrate support member 10, and the suction passage 24 of the extension support member 20 are connected hermetically. A valve seat 15*a* is formed in the recess 15, a ball 15*b* serving as a valve element is seated on the valve seat 15*a*, and the ball 15*b* is held in place by a spring 15*c*. When the extension support member 20 is not connected to the substrate support member 10, the ball 15*b* is seated on the valve seat 15*a* to close the suction passage 14. When the extension support member 20 is connected to the substrate support member 10, the projection 25 depresses the ball 15*b* to open the end of the suction passage 14. The recess 15, the projection 25 and the sealing member 31 constitute a connecting structure.

Referring to FIGS. 4A, 4B, 4C and 4D, an electronic part support member 32 (32') for supporting the electronic part 42 (42') mounted on the glass substrate 41 (41') may be put on the substrate support member 10 (extension support member 20) to prevent the electronic part 42 (42') mounted on the glass substrate 41 (41') from drooping by its own weight. Preferably, the electronic part support members 32 and 32' are shaped so as to be seated on the peripheral part 11*a* of the support body 11 of the substrate support member 10 (FIGS. 4A and 4B) and the peripheral part 21*a* of the support body 21 of the extension support member 20 (FIGS. 4C and 4D), respectively.

The operation of the first embodiment of the present invention thus constructed will be described hereinafter.

First, operations for a case where the electronic parts 42 are mounted on the small glass substrate 41 will be described. The small glass substrate 41 can be supported only by the substrate support member 10 and hence the extension support member 20 is unnecessary.

Referring to FIGS. 5A and 5B, the electronic part 42 is fed by the part feeder 64, and the part transfer mechanism 65 carries the electronic part 42 to the intermediate stage 69. The part transfer mechanism 65 attracts the electronic part 42 by the suction nozzle 66. The Z-axis transfer unit 67 and the Y-axis transfer unit 68 moves the suction nozzle 66 in the Z- and the Y-axis, respectively, to transfer the electronic part 42 attracted to the suction nozzle 66 onto the table 70 of the intermediate stage 69.

Then, the X-axis transfer unit 71 moves the stage 69 in the X-axis to transfer the electronic part 42 mounted on the table 70 to the transfer position T.

In this state, the Z-axis transfer unit 62 and the Y-axis transfer unit 63 of the transfer mechanism 61 move the pressing tool 76 in the Z- and the Y-direction, while the pressing tool 76 picks up the electronic part 42 from the table 70 of the intermediate stage 69 at the transfer position T and transfers the electronic part 42 from the transfer position T to the mounting position B corresponding to a peripheral part of the glass substrate 41.

On the other hand, the transfer mechanism 30 of the substrate carrying device 1 positions the substrate support member 10 at the receiving position R to receive the glass substrate 41. The glass substrate 41 fed by a substrate feeder, not shown, is put on and held by the suction pads 12 and the flatness adjusting mechanisms 13 at the receiving position R.

Then, the transfer mechanism 30 moves the substrate support member 10 to the working position W where the electronic part 42 is pressed on the glass substrate 41. The imaging device 77 and the image processing device provide data on the positional relation between the glass substrate 41 and the electronic part 42 held and positioned at the mounting position B by the pressing tool 76 to align the electronic part 42 with the glass substrate 41.

Subsequently, the Z-axis transfer unit 62 and the Y-axis transfer unit 63 of the transfer mechanism 61 moves the pressing tool 76 on the basis of data on the positional relation between the glass substrate 41 and the electronic part 42 or the transfer mechanism 30 including the X-table 78, the Y-table and the θ-table of the substrate carrying device 1 moves the substrate support member 10 to align the electronic part 42 held by suction by the pressing tool 76 with the glass substrate 41.

Lastly, the pressure block 75 supports a peripheral part of the glass substrate 41 from below, the pressing tool 76 presses the electronic part 42 on the glass substrate 41 to connect the electronic part 42 temporarily to the glass substrate 41 with a connecting member, not shown, such as an anisotropic conductive film.

After thus mounting the electronic parts 42 on the glass substrate 41 at the working position W, the transfer mechanism 30 transfers the substrate support member 10 to the delivery position D to send out the glass substrate 41 mounted with the electronic part 42 to the next process.

Operations for a case where the electronic parts 42' mounted on the large glass substrate 41' will be described hereinafter. The extension support member 20 suitable for supporting the large glass substrate 41' in cooperation with the substrate support member 10 is connected to the substrate support member 10. The substrate support member 10 and the extension support member 20 are combined with the inner peripheral part 21*b* of the support body 21 of the extension support member 20 seated on the outer peripheral part 11*a* of the support body 11 of the substrate support member 10. A combination of the substrate support member 10 and the extension support member 20 supports the large glass substrate 41'.

The transfer mechanism 30 positions the combination of the substrate support member 10 and the extension support member 20 at the receiving position R, and the glass substrate 41' fed by the substrate feeder, not shown, is put on the combination of the substrate support member 10 and the extension support member 20. Then, the transfer mechanism 30 transfers the substrate support member 10 to the working position W to mount the electronic part 42' on the glass substrate 41'. After thus mounting the electronic parts 42' on the glass substrate 41' at the working position W, the transfer mechanism 30 transfers the substrate support member 10 to the delivery position D to send out the glass substrate 41' mounted with the electronic part 42' to the next process. The rest of the operations are the same as those for mounting the electronic parts 42 on the small glass substrate 41.

When the inner peripheral part 21*b* of the support body 21 of the extension support member 20 is seated on the outer peripheral part 11*a* of the support body 11 of the substrate support member 10, the projection 25 of the inner peripheral part 21*b* is inserted in the recess 15 of the outer peripheral part 11*a*, the recess 15 is sealed by the sealing member 31, and the ball 15*b* is separated from the valve seat 15*a* to connect the suction passage 14 of the substrate support member 10 and the suction passage 24 of the extension support member 20 hermetically. Consequently, a vacuum can be produced in both the suction pads 12 and 22 of the substrate support member 10 and the extension support member 20 by the same vacuum source, not shown.

In the first embodiment, the extension support member 20 can be connected to the substrate support member 10 attached to the transfer mechanism 30, in order to support a glass substrate in cooperation with the substrate support member 10. Therefore, it is possible to cope with the change of the sizes of the glass substrates resulting from the change of the types of the flat panel displays, by connecting the extension support member 20 to or disconnecting the same from the substrate support member 10. Only the comparatively light part, i.e., the extension support member 20, needs to be changed instead of changing the entire structure for supporting a glass substrate, i.e., the substrate support member 10 and the extension support member 20, to carry a large substrate. Since the operator is able to handle the extension support member 20 easily, time necessary for conducting changing work for changing the types of flat panel displays can be reduced. Work for connecting the extension support member 20 to the substrate support member 10 can be readily accomplished simply by seating the inner peripheral part 21*b* of the extension support member 20 on the outer peripheral part 11*a* of the substrate support member 10, and the extension support member 20 can be readily disconnected from the substrate support member 10 simply by lifting up the extension support member 20.

Since the substrate carrying device 1 is adapted to cope with the change of the sizes of the glass substrates by connecting the extension support member 20 to or disconnecting the same from the substrate support member 10, it is not necessary to reserve substrate support members of sizes respectively corresponding to those of glass substrates, which reduces the running cost.

Since the glass substrate 41 (41') is supported by the suction pads 12 and the flatness adjusting mechanisms 13 of the substrate support member 10 (the suction pads 12 and 22 and the flatness adjusting mechanisms 13 and 23 of the substrate support member 10 and the extension support member 20), the flatness of a peripheral part of the glass substrate 41 (41') on which the electronic part 42 (42') is mounted can be easily adjusted and the electronic part 42 (42') can be satisfactorily mounted on the glass substrate 41 (41').

Although only the single extension support member 20 is connected to the substrate support member 10 in the first embodiment, further extension support members similar to the extension support member 20 may be connected one after another to the extension support member 20 by using an outer peripheral part 21*a* formed in the support body 21 of the extension support member 20.

Although the suction passages 14 and 24 are connected in the outer peripheral part 11*a* of the support body 11 of the substrate support member 10 and the inner peripheral part 21*b* of the support body 21 of the extension support member 20 in the first embodiment, the suction passages 14 and 24 may be connected outside the substrate support member 10 and the extension support member 20 by a special pipe fitting. Naturally, the suction passages 14 and 24 do not need necessarily to be connected and may be individually connected to the vacuum source, not shown.

Second Embodiment

A substrate carrying device in a second embodiment of the present invention will be described with reference to FIGS. 6A and 6B. The second embodiment excluding a substrate carrying device is identical with the first embodiment shown in FIGS. 1A to 5B. In the second embodiment, parts like or corresponding to those of the first embodiment shown in FIGS. 1A to 5B are denoted by the same reference characters and the description thereof will be omitted.

Referring to FIGS. 6A and 6B, a substrate carrying device 35 in a second embodiment of the present invention has a transfer mechanism 30 capable of translational movement and rotation in an XY-plane, and a substrate support member 36 attached to the transfer mechanism 30 to support a glass substrate thereon.

The substrate support member 36 has a fixed support part (first support part) 37, and movable support parts (second support parts) 38 connected to the fixed support part 37 by a sliding mechanism 39 for movement relative to the fixed support part 37. The movable parts 38 can be moved according to the size of the glass substrate.

Similarly to the substrate carrying device 1 shown in FIGS. 1A and 1B, suction pads for holding the glass substrate by suction, and flatness adjusting mechanisms for adjusting the flatness of the glass substrate can be attached to the respective upper surfaces (support surfaces) of the fixed support part 37 and the movable support parts 38. The sliding mechanism 39 is driven by a driving mechanism 81 to move the movable support parts 38 relative to the fixed support part 37. A controller 82 may control the operation of the driving mechanism 81 to adjust the moving distance of the movable support parts 38 according to the size of the glass substrate.

Referring to FIGS. 6A and 6B, when the substrate carrying device 35 carries a small glass substrate, the movable support parts 38 are joined close to the fixed support part 37 as indicated by continuous lines in FIGS. 6A and 6B. When the substrate carrying device 35 carries a large glass substrate, the movable support parts 38 are separated from the fixed support part 37 to positions indicated by imaginary lines in FIGS. 6A and 6B.

In the substrate support member 36 of the second embodiment, the movable support parts 38 can be moved relative to the fixed support part 37. Therefore, the substrate support member 36 is able to cope with the change of the types of the flat panel displays or the like and the resulting change of the sizes of the glass substrates, simply by moving the movable support parts 38. Thus, the second embodiment, similarly to the first embodiment, reduces time necessary for conducting changing work for changing the types of the flat panel displays and the running cost.

Third Embodiment

A substrate carrying device in a third embodiment of the present invention will be described with reference to FIG. 7, in which parts like or corresponding to those of the first embodiment shown in FIGS. 1A to 5B are denoted by the same reference characters and the description thereof will be omitted. The substrate carrying device in the third embodiment is similar to the first embodiment shown in FIGS. 1A to 5B, except that the substrate carrying device in the third embodiment uses only an extension support member for supporting a glass substrate.

Figure 7:
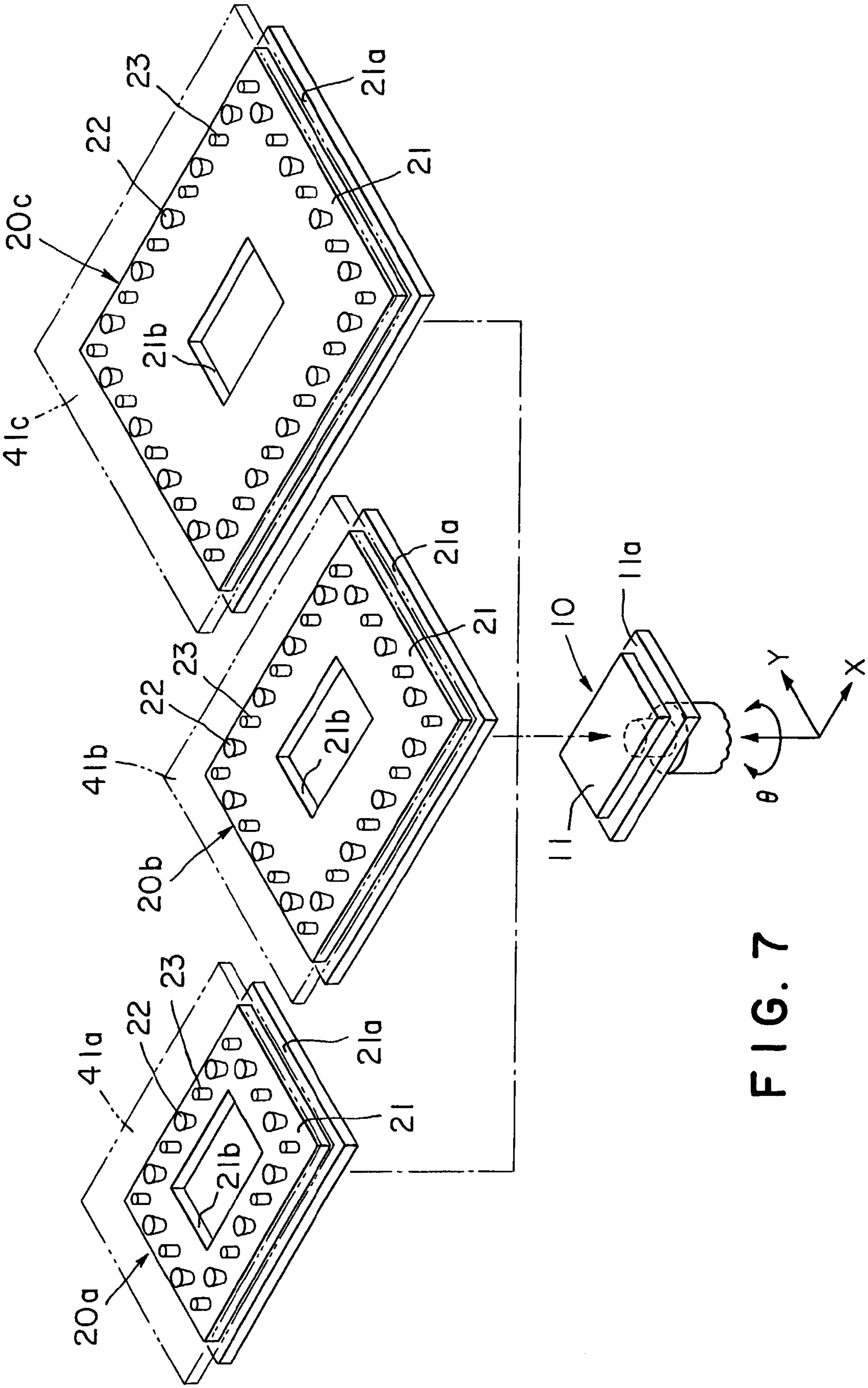
FIG. 7 is a perspective view of a substrate carrying device in a third embodiment of the present invention.
Figure 8A:
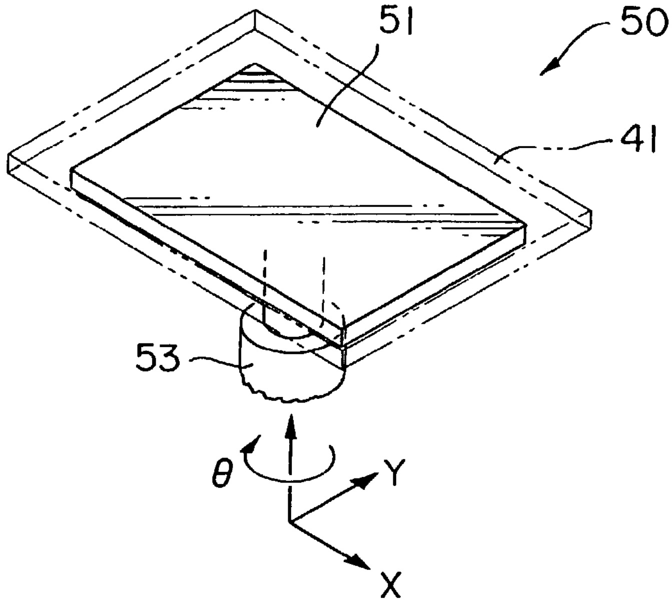
FIGS. 8A and 8B are perspective views of a conventional substrate carrying device.
Figure 8B:
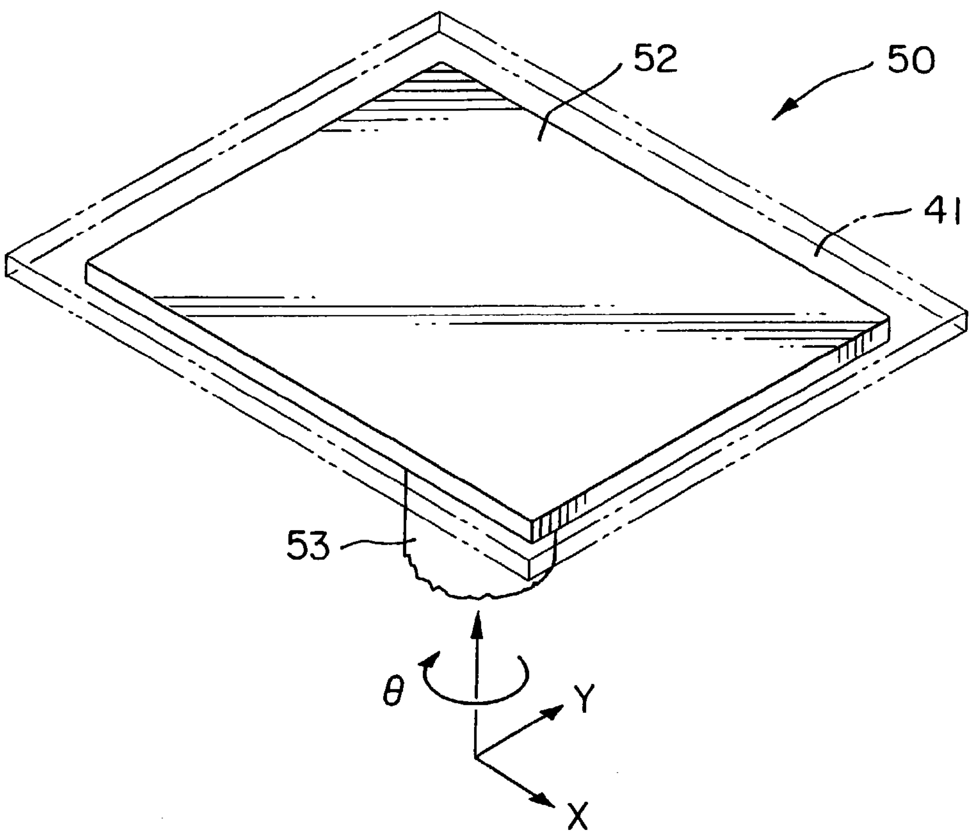

Referring to FIG. 7, the substrate carrying device in the third embodiment has a substrate support member 10 and an extension support member 20, and only the extension support member 20 is provided with suction pads 22 and flatness adjusting mechanisms 23.

More concretely, three extension support members 20*a*, 20*b* and 20*c* respectively having different shapes are reserved, and one of the extension support members 20*a*, 20*b* and 20*c*, suitable for supporting a glass substrate is used selectively. The extension support members 20*a*, 20*b* and 20*c* have connecting parts of the same construction to be connected to the substrate support member 10, respectively; that is the extension support members 20*a*, 20*b* and 20*c* have the same inner peripheral parts 21*b* to be connected to the outer peripheral part 11*a* of the substrate support member 10.

The operation of the third embodiment will be described hereinafter.

When the substrate carrying device is used for carrying a small glass substrate 41*a*, the smallest extension support member 20*a* suitable for supporting the small glass substrate 41*a* is put on the substrate support member 10 such that the inner peripheral part 21*b* of the small extension support member 20*a* is seated on the outer peripheral part 11*a* of a support body 11 included in the substrate support member 10. The small glass substrate 41*a* is attracted to and held by the suction pads 22 and the flatness adjusting mechanisms 23 of the extension support member 20*a*.

When the substrate carrying device is used for carrying a medium glass substrate 41*b*, the medium extension support member 20*b* suitable for supporting the medium glass substrate 41*b* is put on the substrate support member 10 such that the inner peripheral part 21*b* of the medium extension support member 20*b* is seated on the outer peripheral part 11*a* of the support body 11 of the substrate support member 10. The medium glass substrate 41*b* is attracted to and held by the suction pads 22 and the flatness adjusting mechanisms 23 of the extension support member 20*b*.

When the substrate carrying device is used for carrying a large glass substrate 41*c*, the large extension support member 20*c* suitable for supporting the large glass substrate 41*c* is put on the substrate support member 10 such that the inner peripheral part 21*b* of the large extension support member 20*c* is seated on the outer peripheral part 11*a* of the support body 11 of the substrate support member 10. The large glass substrate 41*c* is attracted to and held by the suction pads 22 and the flatness adjusting mechanisms 23 of the large extension support member 20*c*.

In the third embodiment, one of the extension support members 20*a*, 20*b* and 20*c* respectively suitable for supporting the glass substrate 41*a*, 41*b* and 41*c* respectively having different sizes can be connected to the substrate support member 10 attached to the transfer mechanism 30. Therefore, the substrate carrying device is able to cope with the change of the sizes of the glass substrates resulting from the change of the types of the flat panel displays or the like, simply by changing the extension support members 20*a*, 20*b* and 20*c*. Thus, the third embodiment, similarly to the first embodiment, reduces time necessary for conducting changing work for changing the types of the flat panel displays and the running cost.

Since the glass substrates 41*a*, 41*b* and 41*c* are supported by the respective suction pads 22 and the flatness adjusting mechanisms 23 of the extension support members 20*a*, 20*b* and 20*c*, respectively, the flatness of peripheral parts of the glass substrates 41*a*, 41*b* and 41*c* on which the electronic parts are to be mounted can be easily adjusted by adjusting the positions and heights of the posts of the flatness adjusting mechanisms 23. Thus the third embodiment, similarly to the first embodiment, enables satisfactory mounting of electronic parts on the glass substrates 41*a*, 41*b* and 41*c*.

Although the first to the third embodiment have been described as applied to carrying glass substrates, the present invention is not limited thereto and can be applied to carrying substrates other than glass substrates.

The invention claimed is:

1. A substrate carrying device comprising:

a transfer mechanism;

a substrate support member attached to the transfer mechanism; and an extension support member provided at a periphery of the substrate support member, wherein the substrate support member includes a connecting part configured to connect the substrate support member to the extension support member, so that the extension support member supports a substrate in cooperation with the substrate support member.

2. The substrate carrying device according to claim 1, wherein the substrate support member comprises:

a support body having a support surface, the support body having a peripheral connecting part adapted to be joined to a peripheral connecting part formed in the extension support member.

3. The substrate carrying device according to claim 1, wherein the substrate support member comprises:

a support body having a support surface;

a suction member attached to the support surface of the support body and adapted to attract and support the substrate;

a suction passage extended in the support body and connected to the suction member; and a connecting structure configured to connect the suction passage to a suction passage included in the extension support member, wherein the connecting structure connects the suction passage of the substrate support member to the suction passage of the extension support member when the extension support member is connected to the substrate support member.

4. The substrate carrying device according to claim 3, wherein the substrate support member further comprises:

a support body having a support surface;

a suction member attached to the support surface of the support body and adapted to attract and hold the substrate; and a flatness adjusting mechanism configured to adjust flatness of the substrate held by the suction member.

5. The substrate carrying device according to claim 1, wherein the extension support member comprises:

a support body having a support surface;

a suction member attached to the support surface of the support body and adapted to attract and hold the substrate; and a flatness adjusting mechanism configured to adjust flatness of the substrate held by the suction member.

6. The substrate carrying device according to claim 1, further comprising an electronic part support member for supporting an electronic part mounted on the substrate.

7. The substrate carrying device according to claim 1, further comprising:

a detecting device configured to detect condition of connection of the extension support member to the substrate support member; and a decision device configured to decide whether or not a substrate to be carried is suitable for carrying on the basis of result of detection by the detecting device and a size of the substrate to be carried.

8. A substrate carrying device comprising:

a transfer mechanism; and a substrate support member attached to the transfer mechanism and configured to support a substrate, wherein the substrate support member includes a first support part, and a second support part, the second support part provided at a periphery of the first support part and movably connected to the first support part so as to support the substrate in cooperation with the first support part.

9. The substrate carrying device according to claim 8, further comprising:

a driving mechanism configured to drive the second support part for movement relative to the first support part; and a controller configured to control a distance for which the second support part is moved by the driving mechanism, on the basis of a size of the substrate to be carried.

10. The substrate carrying device according to claim 1, wherein the connecting part is provided at an outer circumference of the substrate support member and configured to be joined to an inner circumference of the extension support member, and the extension support member joined to the substrate support member has a size corresponding to a size of the substrate to be carried, so that the extension support member can support the substrate at a different position in accordance with the size of the substrate to be carried.

11. The substrate carrying device according to claim 10, wherein the substrate support member comprises:

a support body having a peripheral connecting part configured to be joined to a peripheral connecting part formed in the extension support member.

12. The substrate carrying device according to claim 10, wherein the extension support member comprises:

a support body having a support surface;

a suction member attached to the support surface of the support body and configured to attract and hold the substrate; and a flatness adjusting mechanism configured to adjust the flatness of the substrate held by the suction member.

* * * * *